(12) United States Patent
Yu et al.

(10) Patent No.: US 6,300,191 B1
(45) Date of Patent: Oct. 9, 2001

(54) METHOD OF FABRICATING A CAPACITOR UNDER BIT LINE STRUCTURE FOR A DYNAMIC RANDOM ACCESS MEMORY DEVICE

(75) Inventors: Chih-Hsing Yu; Kuo-Chi Tu, both of Hsin-Chu (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/783,382

(22) Filed: Feb. 15, 2001

(51) Int. Cl.$^7$ .............................................. H01L 21/8242
(52) U.S. Cl. ........................................ 438/253; 438/255
(58) Field of Search .................................... 438/238–240, 438/253–256, 396–399

(56) References Cited

U.S. PATENT DOCUMENTS

| | | | |
|---|---|---|---|
| 5,206,183 | 4/1993 | Dennison | 437/47 |
| 5,874,335 | 2/1999 | Jeng | 438/253 |
| 5,926,710 | 7/1999 | Tseng | 438/253 |
| 5,933,726 | 8/1999 | Nishimura et al. | 438/254 |
| 6,037,213 | 3/2000 | Shih et al. | 438/253 |
| 6,083,789 | 7/2000 | Huang et al. | 438/254 |
| 6,110,774 | 8/2000 | Jost et al. | 438/253 |

*Primary Examiner*—Jey Tsai
(74) *Attorney, Agent, or Firm*—George O. Saile; Stephen B. Ackerman

(57) ABSTRACT

A process of forming a capacitor under bit line (CUB), structure, for a DRAM device, highlighted by simultaneous definition of the storage node structures, and a bit line contact structure, and by simultaneous definition of the capacitor top plate, and the bit line opening, has been developed. The process features forming a narrow diameter bit line contact hole, exposing a underlying polysilicon plug structure, while forming wider diameter, capacitor openings, to other underlying polysilicon plug structures. Polysilicon deposition, followed by a chemical mechanical polishing procedure, results in the simultaneous definition of the storage node, and bit line contact structures. Subsequent processing, comprising polysilicon and silicon oxide depositions, followed by an anisotropic RIE procedure, allow the definition of the capacitor structure to be defined simultaneously with the formation of a bit line opening.

31 Claims, 7 Drawing Sheets

METHOD OF FABRICATING A CAPACITOR UNDER BIT LINE STRUCTURE FOR A DYNAMIC RANDOM ACCESS MEMORY DEVICE

BACKGROUND OF THE INVENTION (1) Field of the Invention

The present invention relates to methods used to fabricate semiconductor devices, and more specifically to a method of fabricating a capacitor under bit line (CUB), structure, for a dynamic random access memory (DRAM, device.

(2) Description of Prior Art

The continuing increase in the density of DRAM cells, achieved via micro-miniaturization, or the ability to fabricate devices with sub-micron features, has led to difficulties in achieving the desired capacitance for an individual DRAM device. The horizontal dimensions of a stacked capacitor structure, used in each DRAM device, in now limited by the decreasing size, or width, of the DRAM device, thus placing greater demands on increasing the height, or vertical dimension of the stacked capacitor structure, to provide the needed surface area and thus the needed capacitance. However increasing the vertical dimensions of the DRAM, stacked capacitor structure, results in the use of thicker insulator layers, used to accommodate deeper capacitor openings, and to provide adequate passivation for the underlying stacked capacitor structure. The use of thicker insulator layers in turn, result in added process complexity in terms of an increased aspect ratio for the dry etched, narrow diameter bit line contact holes, used in the CUB DRAM designs. In addition the decreased spacing between the stacked capacitor structure and the bit line structure, can lead to electrical leakage or shorts between these key DRAM elements.

This invention will describe a novel method of fabricating a CUB DRAM device, in which the aspect ratio of the dry etched, bit line contact hole is not increased as a result of increasing vertical dimensions of the capacitor structure. In addition this invention will teach a method of providing insurance against leakage, or shorts, that can occur between the bit line contact structure and the capacitor structure. Prior art, such as Tseng, in U.S. Pat. No. 5,926,710, presents a fabrication procedure for a stacked capacitor structure, while Jost et al, in U.S. Pat. No. 6,110,774, show a fabrication procedure for a capacitor under bit line capacitor structure. However these prior arts do not use the novel process steps and process sequences, presented in the present invention, which allow a reduction in bit line contact hole aspect ratio, and improved isolation between the bit line and capacitor structures, to be realized.

SUMMARY OF THE INVENTION

It is an object of this invention to form a capacitor under bit line (CUB), DRAM device, featuring a reduction of the aspect ratio of a bit line contact hole, and featuring improved isolation between the stacked capacitor structure and the bit line structure.

It is another object of this invention to reduce the process complexity of forming a bit line contact structure in a narrow diameter contact hole via forming the bit line contact plug structure, simultaneously with the formation of the capacitor storage node structure.

It is still another object of this invention to reduce leakage and shorts between the stacked capacitor, and bit line structures, via formation of insulator spacers on the sides of the bit line opening.

In accordance with the present invention a method of fabricating a CUB DRAM device, featuring process steps and sequences which reduce the aspect ratio of a bit line contact hole, and reduce the risk of leakage and shorts between a stacked capacitor structure and a bit line structure, is described. After formation of transfer gate transistors, and deposition of a first insulator layer, self-aligned contact (SAC), openings are formed in the first insulator layer, exposing source/drain regions of the transfer gate transistors. Formation of polysilicon plugs, in the SAC openings, are next made, with a first group of polysilicon plugs designed for storage node contact plugs, and with a second polysilicon plug to be used for a lower level, bit line contact plug. Deposition of a second insulator layer is followed by creation of capacitor openings in the second insulator layer, exposing the top surface of the storage node contact plugs, and simultaneous creation of a narrow diameter, bit line contact hole in the second insulator layer, exposing a portion of the lower level bit line contact plug. Deposition of a polysilicon layer coats the exposed surfaces of the capacitor openings, while completely filling the narrow diameter, bit line contact hole. After formation of a hemispherical grain silicon layer, on the underlying polysilicon layer, a chemical mechanical polishing procedure is used to simultaneous define the storage node structures, in the capacitor openings, as well defining an upper level, bit line contact plug in the narrow diameter, bit line contact hole. Deposition of a capacitor dielectric layer, a polysilicon layer, and a third insulator layer, are followed by a patterning procedure performed in the third insulator layer and in the polysilicon layer, resulting in definition of crown shaped capacitor structures, comprised of an underlying storage node structure, a capacitor dielectric layer, and an overlying top electrode structure, comprised from the polysilicon layer, and resulting in the simultaneous definition of a bit line opening in the third insulator layer, exposing the top surface of the upper level, bit line contact plug. After formation of insulator spacers, on the sides of the bit line opening, a bit line structure is formed in the bit line opening, overlying and contacting, the upper level, bit line contact plug.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
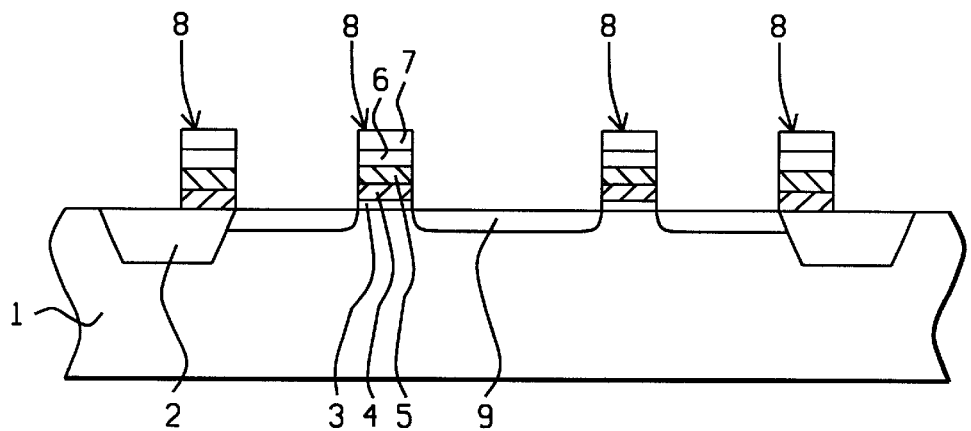
FIGS. 1–10, which schematically, in cross-sectional style, describe key stages of fabrication used to create a CUB, DRAM device, featuring the use of two levels of bit line plug structures to reduced the aspect ratio of a bit line contact hole, and featuring insulator spacers on the sides of a bit line opening to reduce the risk of leakage and shorts between a stacked capacitor structure and a bit line structure.

The method of fabricating a DRAM capacitor under bit line (CUB), device, featuring process steps and sequences which reduce the aspect ratio of a dry etched bit line contact hole, and reduce the risk of leakage and shorts between a stacked capacitor structure and a bit line structure, will now be described in detail. A P type, semiconductor substrate 1, comprised of single crystalline silicon with a <100> crystallographic orientation, is used and schematically shown in FIG. 1. Isolation regions 2, are next formed, comprised of either insulator filled, shallow trenches, or of thermally grown, field oxide regions. Silicon dioxide gate insulator layer 3, is the thermally grown to a thickness between about 50 to 150 Angstroms. Insulator capped gate structures 8, shown schematically in FIG. 1, are next formed on silicon dioxide gate structure 3. Insulator layer capped gate structures 8, are comprised of an underlying layer of polysilicon layer 4, obtained via low pressure chemical vapor deposition (LPCVD), procedures, to a thickness between about 500 to 2000 Angstroms; tungsten silicide layer 5, obtained via LPCVD procedures, to a thickness between about 500 to 1000 Angstroms; silicon dioxide layer 6, obtained via LPCVD or plasma enhanced chemical vapor deposition (PECVD), procedures, to a thickness between about 500 to 1000 Angstroms, using tetraethylorthosilicate as a source; and an overlying silicon nitride layer, obtained via LPCVD or PECVD procedures, at a thickness between about 500 to 1000 Angstroms. Polysilicon layer 4, is a doped polysilicon layer, either doped in situ during deposition via the addition of arsine, or phosphine, to a silane ambient, or grown intrinsically then doped via implantation of arsenic or phosphorous ions. Conventional photolithographic and anisotropic procedures, using $CF_4$ and $Cl_2$ as an etchant for silicon nitride layer 7, using $CHF_3$ as an etchant for silicon oxide layer 6, and using $Cl_2$ or $SF_6$ as an etchant for tungsten silicide layer 5, and for polysilicon layer 4, are employed to define insulator capped gate structures 8, shown schematically in FIG. 1. Removal of the photoresist shape used for definition of insulator capped gate structures 8, is accomplished via plasma oxygen ashing and careful wet cleans. Source/drain regions 9, are next formed in regions of semiconductor substrate 1, not covered by insulator capped gate structures 8, via implantation of arsenic or phosphorous ions, at an implant energy between about 10 to 30 KeV, and at an implant dose between about 1 E13 to 1 E14 atoms/cm$^2$.

Figure 2:
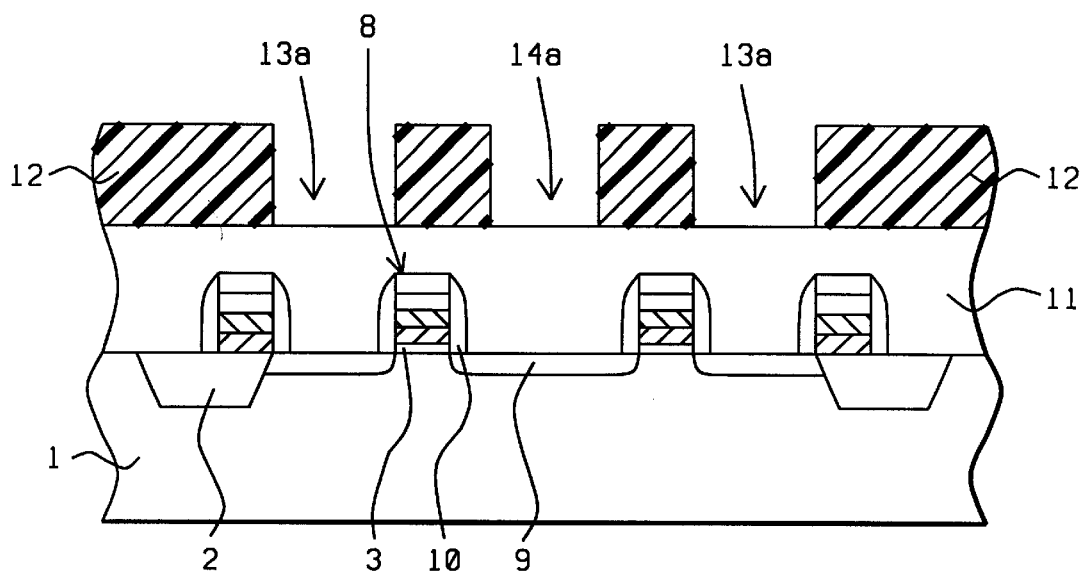

A silicon nitride layer is next deposited via LPCVD or PECVD procedures, at a thickness between about 500 to 1000 Angstroms, then subjected to a blanket, anisotropic, reactive ion etching (RIE), procedure, using $CF_4$ or $Cl_2$ as an etchant, to form silicon nitride spacers 10, on the sides of insulator capped gate structures 8. Insulator layer 11, comprised of either silicon oxide, or boro-phosphosilicate glass (BPSG), is next deposited via LPCVD or PECVD procedures, at a thickness between about 5000 to 10000 Angstroms. A chemical mechanical polishing (CMP), procedure is then employed for planarization purposes, resulting in a smooth top surface topography for insulator layer 11. Photoresist shape 12, is next formed on insulator layer 11, to be subsequently used as an etch mask, allowing definition of self-aligned contact (SAC), openings to be accomplished. Photoresist shape 12, is comprised with openings 13a, and opening 14a. This is schematically shown in FIG. 2.

Figure 3:
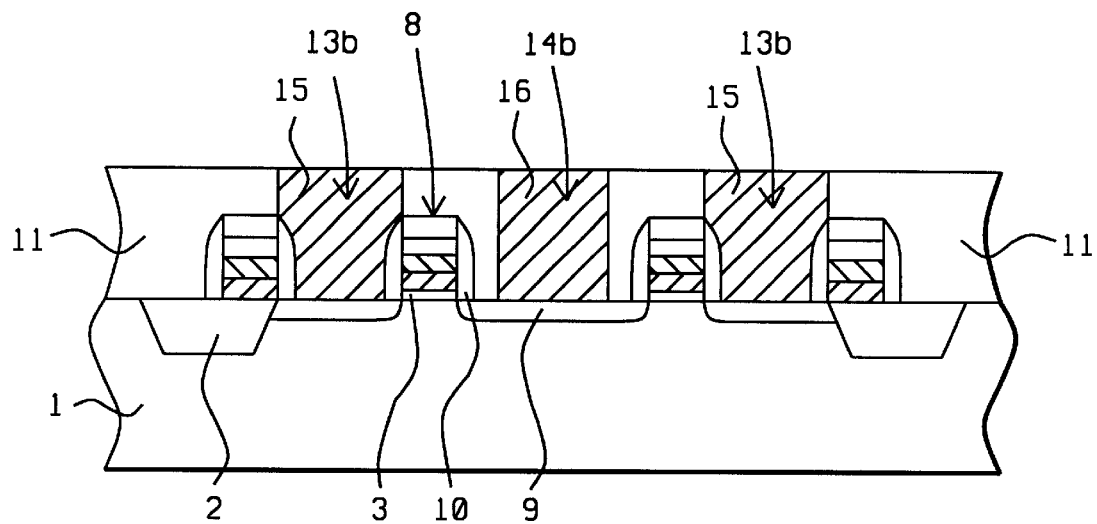

An anisotropic RIE procedure, using $CHF_3$ as an etchant, is next employed to selectively create SAC openings 13b, and SAC opening 14b, in insulator layer 11, exposing portions of source/drain regions 9. SAC openings 13b, will be used to accommodate storage node, polysilicon plugs structures, while SAC opening 14b, will be used to accommodate a lower level bit line contact, polysilicon plug structure. After removal of photoresist shape 12, via plasma oxygen ashing and careful wet cleans, a polysilicon layer is deposited, at a thickness between about 1000 to 3000 Angstroms, via an LPCVD procedures, completely filling SAC openings 13b, and SAC opening 14b. The polysilicon layer is doped in situ during deposition via the addition of arsine, or phosphine, to a silane ambient. A CMP procedure, or a selective RIE procedure, using $Cl_2$ or $SF_6$ as an etchant, is used to remove polysilicon from the top surface of insulator layer 11, resulting in storage node, polysilicon plug structures 15, in SAC openings 13b, and lower level bit line contact, polysilicon plug structure 16, in SAC opening 14b. The result of these procedures is schematically shown in FIG. 3.

Figure 4:
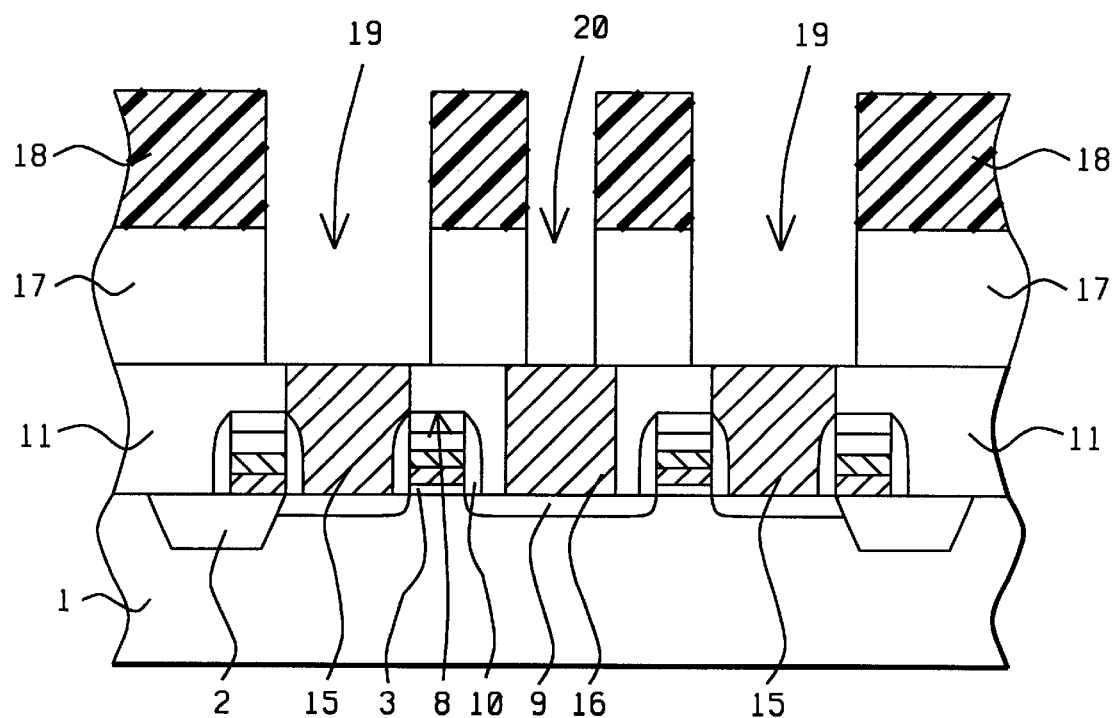

Insulator layer 17, comprised of silicon oxide, or BPSG, is next deposited via LPCVD or PECVD procedures to a thickness between about 8000 to 20000 Angstroms. Photoresist shape 18, is then formed on insulator layer 17, and used as an etch mask to allow definition of capacitor, or storage node openings 19, and definition of narrow diameter, bit line contact hole 20, to be accomplished via an anisotropic RIE procedure using $CF_4$ as an etchant. The diameter of bit line contact hole 20, is between about 0.15 to 0.25 $\mu$m, exposing a portion of the top surface of lower level bit line contact structure 16. The wider diameter capacitor openings 19, expose the entire top surface of storage node polysilicon plug structures 15. This is schematically shown in FIG. 4. The use of narrow diameter, bit line contact hole 20, formed only in insulator layer 17, exposing lower level bit line contact structure 16, reduced the aspect ratio of the bit line contact hole, when compared to counterparts comprised with a high aspect ratio, bit line contact hole, resulting from formation of a bit line contact hole in insulator layer 17, as well as in insulator layer 11.

Figure 5:
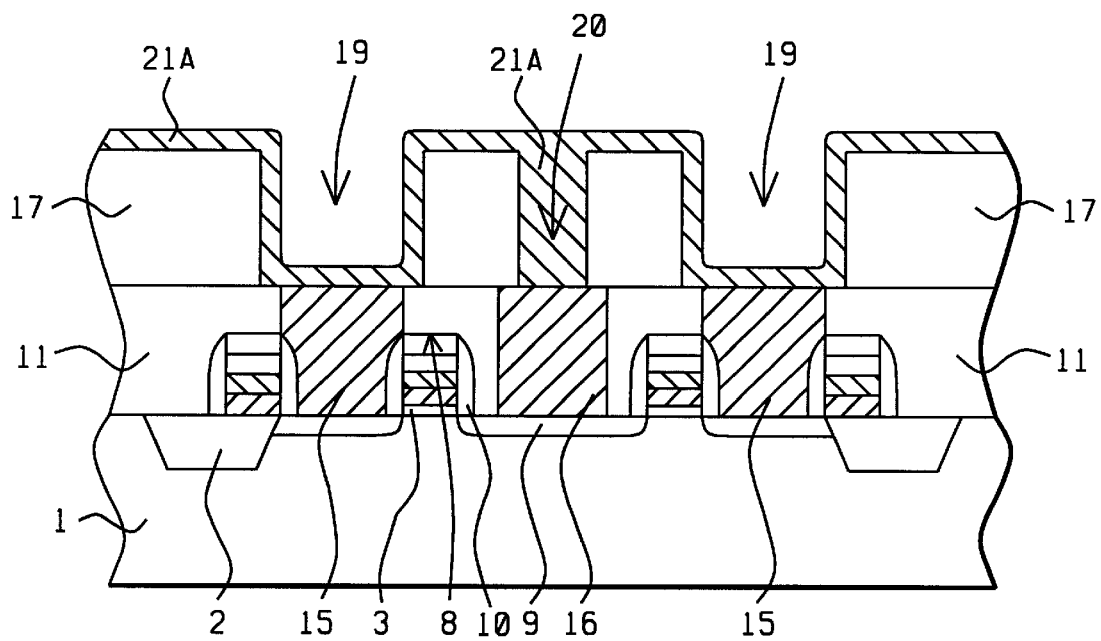
Figure 6:
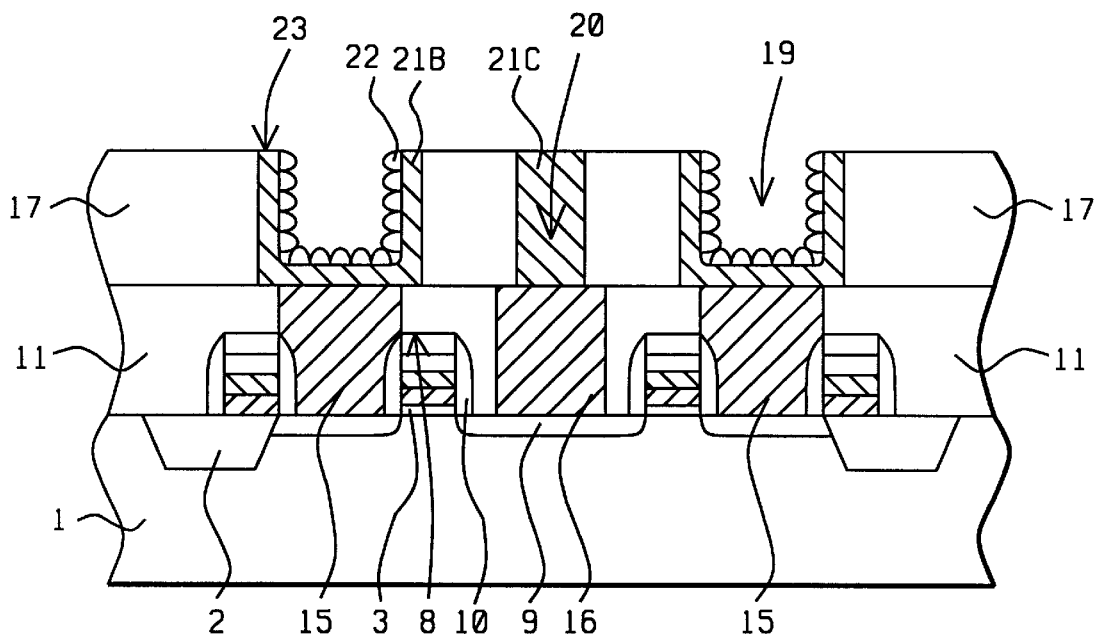

After removal of photoresist shape 18, via plasma oxygen ashing and careful wet cleans, polysilicon layer 21a, is deposited via LPCVD procedures to a thickness between about 1000 to 2000 Angstroms. Polysilicon layer 21a, completely fills narrow diameter, bit line contact hole 20, while only coating the exposed surfaces of the wider diameter, capacitor openings 19. If desired an amorphous silicon layer can be used in place of polysilicon layer 21a This is schematically shown in FIG. 5. Deposition of hemispherical silicon (HSG seeds), on polysilicon layer 21a, is next performed at a temperature between about 500 to 550°C., followed by an anneal procedure, performed at a temperature between about 550 to 580°C., used to convert the HSG seeds, on the polysilicon layer to larger grain HSG layer 22, on underlying polysilicon layer. A critical CMP procedure is then employed to remove the portions of HSG layer 22, and the portions of polysilicon layer 21a, located on the top surface of insulator layer 17, creating storage node structures 23, comprised of HSG layer 22, overlying polysilicon component 21b, residing in capacitor openings 19. Storage node structures 23, overlay and contact, underlying storage node, polysilicon plug structures 15. In addition the CMP procedure, removing exposed portions of HSG layer 22, and polysilicon layer 21a, resulted in the formation of upper level, bit line contact plug 21c, in narrow diameter, bit line contact hole 20. The simultaneous definition of storage node structures 23, and upper level, bit line contact plug 21c, via a polysilicon deposition and CMP procedure, is a key feature of this invention. Upper level, bit line contact plug 21c, schematically shown in FIG. 6, overlays and contacts, wider diameter, lower level bit line contact structure 16.

Figure 7:
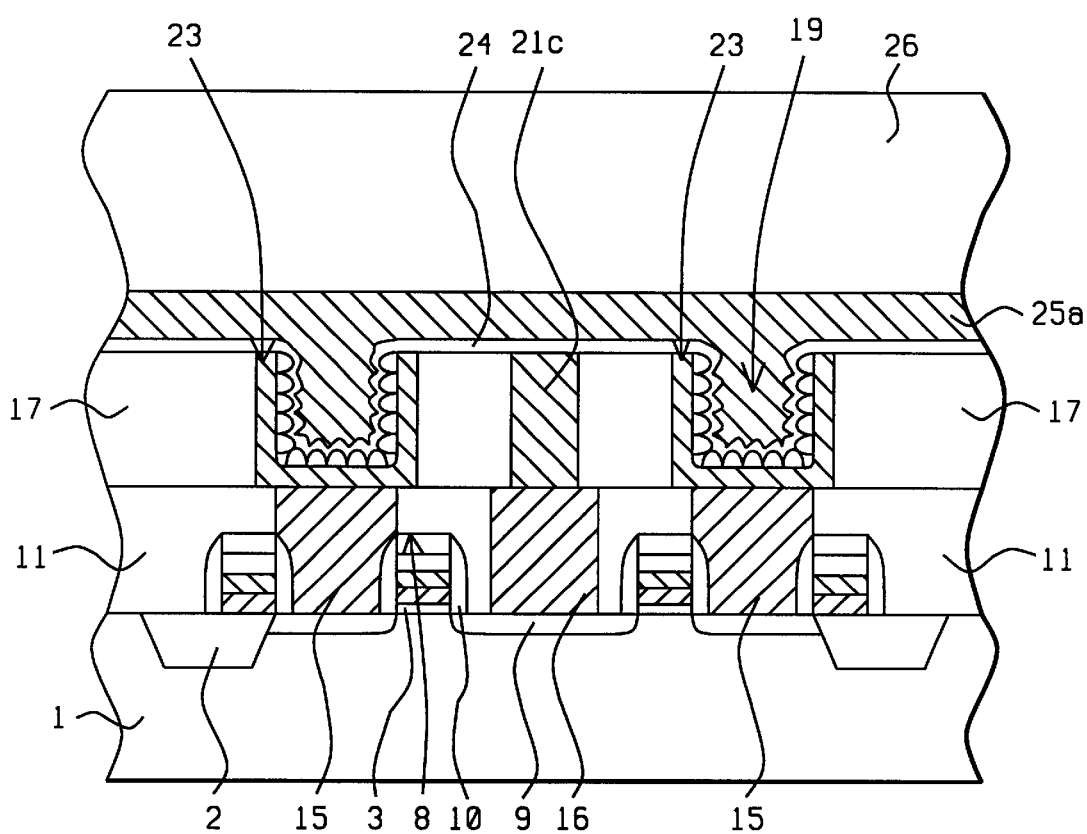

Capacitor dielectric layer 24, chosen from a group that includes tantalum oxide, silicon oxynitride, silicon nitride, and silicon oxide, is next formed via chemical vapor deposition procedures, to a thickness between about 40 to 100 Angstroms. Capacitor dielectric layer 24, can also be an oxidized silicon nitride (NO), layer, obtained at a thickness between about 40 to 60 Angstroms, via deposition of a silicon nitride layer and followed by an oxidation procedure performed at a temperature between about 700 to 850° C., in an oxygen-steam ambient. Polysilicon layer 25a, is next deposited via LPCVD procedures, at a thickness between about 500 to 1500 Angstroms, completely filling capacitor openings 19. Polysilicon layer 25a, is doped in situ during deposition, via the addition of arsine, or phosphine, to a silane ambient. Insulator layer 26, comprised of silicon oxide, or BPSG, is then formed on polysilicon layer 25a, via LPCVD or PECVD procedures, at a thickness between about 2000 to 4000 Angstroms. The result of these depositions, capacitor layer 24, polysilicon layer 25a, and insulator layer 26, is schematically shown in FIG. 7.

Figure 8:
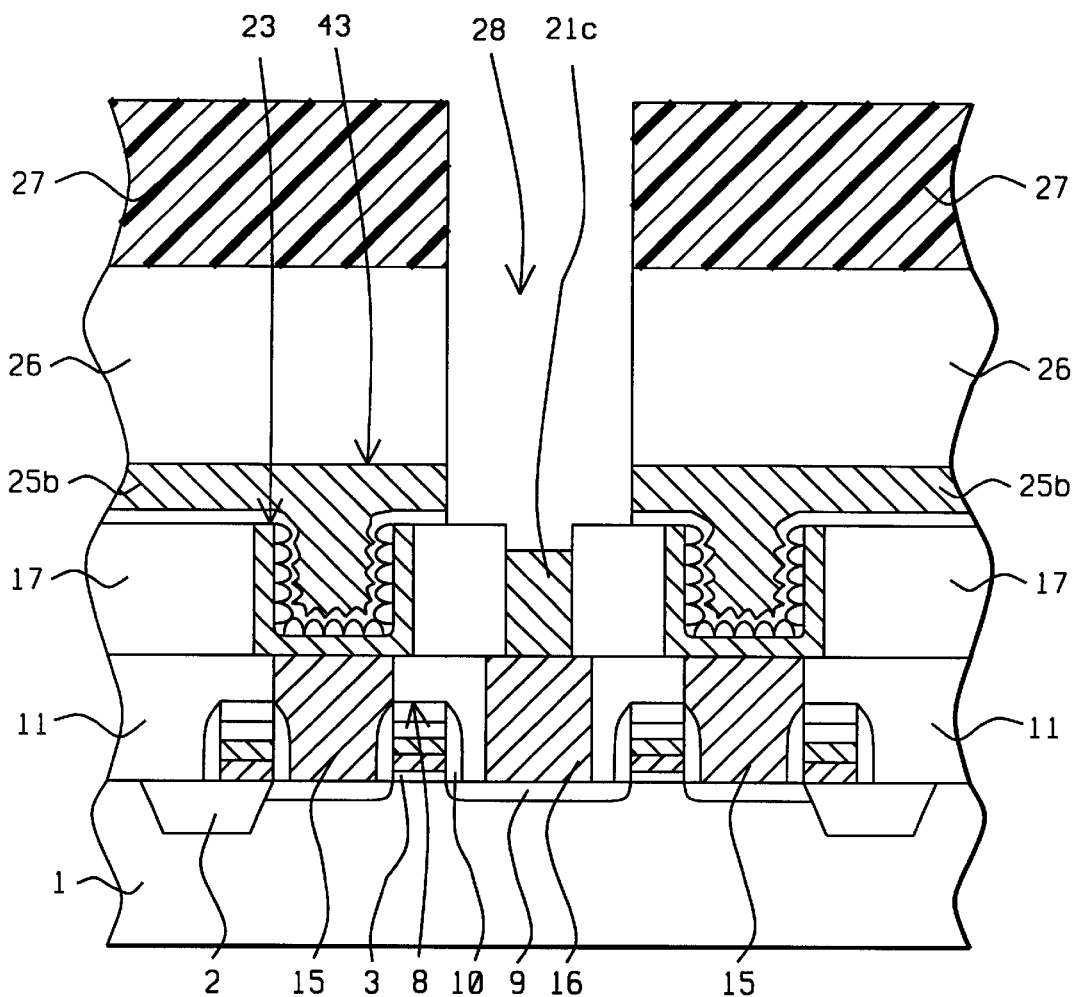

Another critical feature of this invention, the simultaneous definition of the capacitor top plate and the creation of a bit line opening, is next addressed, and schematically shown in FIG. 8 Photoresist shape 27, is employed as an etch mask to allow formation of bit line opening 28, to be performed in insulator layer 26, and in polysilicon layer 25a. This is accomplished via anisotropic RIE procedures, using $CHF_3$ as an etchant for insulator layer 25, and capacitor dielectric layer 24, while using $Cl_2$ as an etchant for polysilicon layer 25a. An over etch cycle, used to insure complete definition of bit line opening 28, results in a recessing of upper level, bit line contact plug 21c, now exposed in bit line opening 28. The same anisotropic procedure, results in the definition of polysilicon top plate 25b, creating capacitor structure 29, now comprised of polysilicon top plate 25b, capacitor dielectric layer 24, and storage node structure 23.

Figure 9:
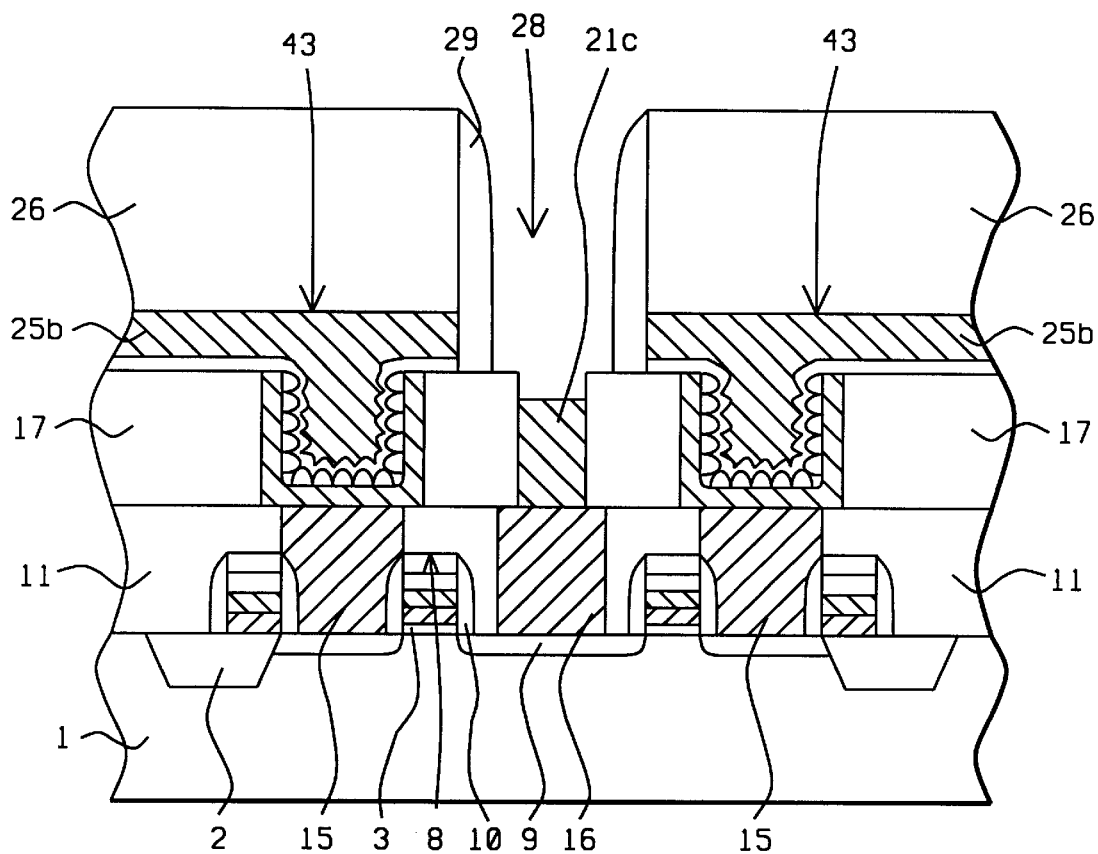

After removal of photoresist shape 27, via plasma oxygen ashing and careful wet cleans, insulator spacers 29, are formed on the sides of bit line opening 28. This is accomplished via deposition of silicon nitride, or silicon oxide, via LPCVD or PECVD procedures, at a thickness between about 500 to 1500 Angstroms, followed by a blanket, anisotropic RIE procedure, using $Cl_2$ or $CF_4$ as an etchant. Insulator spacers 29, shown schematically in FIG. 9, offers several advantages, such as reduction in leakage or shorts between capacitor structure 29, and a bit line structure, to be subsequently formed in bit line opening 28. In addition insulator spacers reduce the deleterious effects of misalignment of bit line opening 28.

Figure 10:
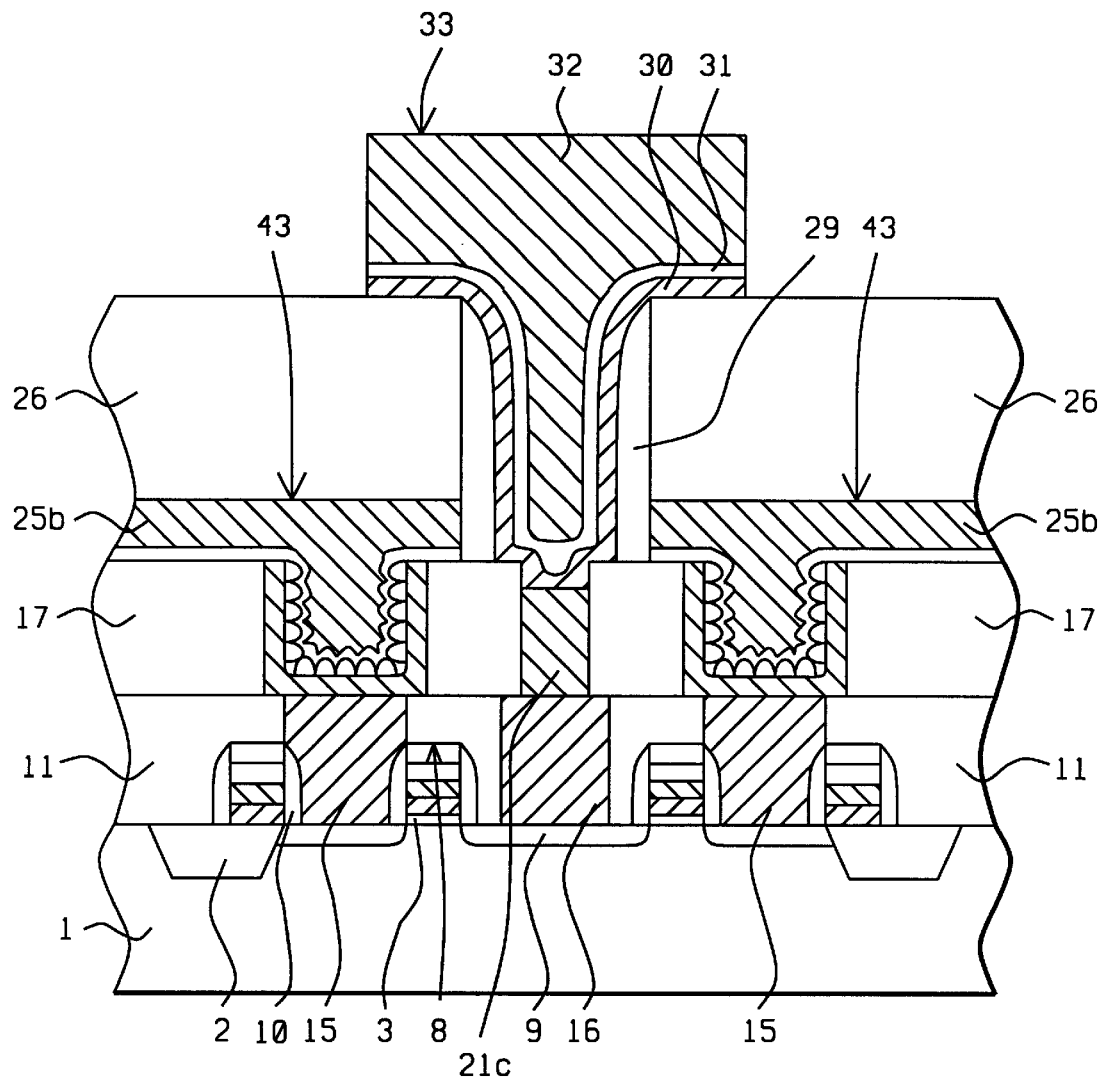

Bit line structure 33, shown schematically in FIG. 10, is next formed in bit line opening 28. A titanium layer 30, to serve as an adhesive layer, is first deposited via plasma vapor deposition (PVD), procedures, at a thickness between about 100 to 400 Angstroms. Titanium nitride layer 31, is next deposited, again via PVD procedures, at a thickness between about 100 to 400 Angstroms. Titanium nitride layer 31, functioning as a barrier layer, will protect underlying materials from the corrosive by-products, created during an LPCVD procedure used to deposit tungsten layer 32. Tungsten layer 32, obtained at a thickness between about 1000 to 2000 Angstroms, completely fills bit line opening 28. A photoresist shape, not shown in the drawings, is next formed on the top surface of tungsten layer 32, then used as an etch mask to allow definition of bit line structure 33, comprised of tungsten, titanium nitride and underlying titanium layer, to be accomplished via a RIE procedure, employing $Cl_2$ or $SF_6$ as an etchant. This is schematically shown in FIG. 10. The photoresist shape used for definition of bit line structure 33, is again removed via plasma oxygen ashing and careful wet cleans.

Another iteration ( not shown in the drawings), of this invention is to form the CUB DRAM device, without the use of SAC polysilicon plug structures, used for storage node contact, and for the lower level bit line contact structures. This is accomplished by forming a capacitor opening in the second insulator layer 17, and in a top portion of the first insulator layer, with the capacitor opening extending through the SAC opening, exposing a source/drain region. The surface area of a capacitor structure, formed in this capacitor opening would therefore be increased when compared to counterpart capacitor structures formed only in first insulator layer 17. However the elimination of the SAC polysilicon plug structures necessitate the formation of a narrow diameter bit line contact hole in both second insulator layer 17, as well as in first insulator layer 11, resulting in an increased aspect ratio for the bit line contact hole. The key features of this invention such as simultaneous patterning of bit line contact structure and storage node structures; simultaneous patterning of the capacitor structure with the creation of a bit line opening; and the use of silicon nitride spacers on the sides of the bit line opening, are still used in this iteration.

While this invention has been particularly shown and described with reference to the preferred embodiments thereof, it will be understood by those skilled in the art that various changes in form and details may be made without departing from the spirit or scope of the invention.

What is claimed is:

1. A method of fabricating a capacitor under bit line structure, for a dynamic random access memory (DRAM), device, on a semiconductor substrate, comprising the steps of:

forming transfer gate transistors on said semiconductor substrate, comprised of gate structures located on an underlying gate insulator layer, with first insulator spacers on the sides of said gate structures, and comprised with source/drain regions located in a region of said semiconductor substrate not covered by said gate structures;

forming self-aligned contact (SAC), openings in said first insulator layer, exposing top portions of said source/drain regions;

forming conductive plugs in said SAC openings, having a first group of conductive plugs and a second group of conductive plugs;

forming capacitor openings in a second insulator layer, exposing the top portion of a first group of conductive plugs to be used for storage node contacts, and forming a bit line contact hole, exposing said second group of conductive plugs to be used as a lower level bit line contact structure;

depositing a conductive layer, such as a first polysilicon layer, with said conductive layer covering exposed surfaces of said capacitor openings, and with said first polysilicon layer completely filling said bit line contact hole;

removing portions of said conductive layer from the top surface of said second insulator layer, to form storage node structures in said capacitor openings, and to simultaneously form an upper level, bit line contact structure in said bit line contact hole;

depositing a capacitor dielectric layer, a second polysilicon layer, and an overlying third insulator layer;

performing a patterning procedure in said third insulator layer, in said second polysilicon layer, and in said capacitor dielectric layer, to form a bit line opening, exposing the top surface of said upper level bit line contact structure, and to simultaneously define capacitor structures, comprised of an overlying top electrode structure, said capacitor dielectric layer, and said storage node structure, with said top electrode structure comprised of said second polysilicon layer;

forming second insulator spacers on the sides of said bit line opening; and forming a bit line structure in said bit line contact opening.

2. The method of claim 1, wherein said first insulator spacers are silicon nitride spacers, formed from a silicon nitride layer which in turn is obtained via LPCVD or PECVD procedures, at a thickness between about 500 to 1500 Angstroms.

3. The method of claim 1, wherein said first insulator layer is a silicon oxide layer, obtained via LPCVD or PECVD procedures, at a thickness between about 5000 to 10000 Angstroms.

4. The method of claim 1, wherein said conductive plugs are polysilicon plugs, formed from a polysilicon layer which in turn is obtained via LPCVD procedures, and doped in situ during deposition via the addition of arsine, or phosphine, to a silane ambient.

5. The method of claim 1, wherein said second insulator layer is a silicon oxide layer, obtained via LPCVD or PECVD procedures, at a thickness between about 8000 to 20000 Angstroms.

6. The method of claim 1, wherein said capacitor openings, and said bit line contact hole, are formed via an anisotropic RIE procedure using $CF_4$ or $CHF_3$ as an etchant for said second insulator layer.

7. The method of claim 1, wherein the diameter of said bit line contact hole is between about 0.15 to 0.25 um.

8. The method of claim 1, wherein said conductive layer is a first polysilicon layer, obtained via LPCVD procedures at a thickness between about 1000 to 2000 Angstroms.

9. The method of claim 1, wherein said conductive layer is a composite layer comprised of an HSG silicon layer, formed an underlying polysilicon or on an underlying amorphous silicon layer, where the HSG silicon layer is formed by deposition of an HSG seed layer, at a temperature between about 500 to 550° C., then annealed at a temperature between about 550 to 580°C., to convert the HSG silicon seed layer to a HSG silicon layer.

10. The method of claim 1, wherein said storage node structures, and said upper level bit line contact structure, are simultaneously defined via removal of said portions of said HSG silicon layer, and portions of said first polysilicon layer, from the top surface of said second insulator layer, via a chemical mechanical polishing procedure.

11. The method of claim 1, wherein said capacitor dielectric layer is an oxidized silicon nitride (NO), layer, formed at a thickness between about 40 to 60 Angstroms.

12. The method of claim 1, wherein said second polysilicon layer is obtained via LPCVD procedures, at a thickness between about 500 to 1500 Angstroms, and doped in situ during deposition via the addition of arsine, or phosphine, to a silane ambient.

13. The method of claim 1, wherein said third insulator layer is a silicon oxide layer, obtained via LPCVD or PECVD procedures, at a thickness between about 2000 to 4000 Angstroms.

14. The method of claim 1, wherein said capacitor structures, and said bit line opening are simultaneously defined via an anisotropic RIE procedure, using $CHF_3$ as an etchant for said third insulator layer and for said capacitor dielectric layer, while using $Cl_2$ as an etchant for said second polysilicon layer.

15. The method of claim 1, wherein said insulator spacers are silicon nitride, or silicon oxide spacers formed from a silicon nitride, or from a silicon oxide layer, which in turn was obtained via LPCVD or PECVD procedures, at a thickness between about 500 to 1500 Angstroms, then defined via a blanket anisotropic RIE procedure, using $Cl_2$ or $CF_4$ as an etchant.

16. The method of claim 1, wherein said bit line structure is comprised of an underlying titanium layer, obtained via PVD procedures at a thickness between about 100 to 400 Angstroms, a titanium nitride layer, obtained via PVD procedures at a thickness between about 100 to 400 Angstroms, and an overlying tungsten layer, obtained via LPCVD procedures at a thickness between about 1000 to 2000 Angstroms.

17. A method of fabricating a capacitor under bit line structure for a dynamic random access memory (DRAM), device, on a semiconductor substrate, featuring simultaneous patterning of storage node structures and a bit line contact structure, and simultaneous definition of capacitor structures and a bit line opening, comprising the steps of:

forming transfer gate transistors on said semiconductor substrate, comprised of silicon nitride capped, polycide gate structures located on an underlying silicon dioxide gate insulator layer, with first silicon nitride spacers on the sides of said silicon nitride capped, polycide gate structures, and comprised with source/drain regions located in a region of said semiconductor substrate not covered by said silicon nitride capped, polycide gate structures;

depositing a first silicon oxide layer;

forming self-aligned contact (SAC), openings in said silicon oxide layer, exposing top portions of said source/drain regions;

depositing a first polysilicon layer, completely filing said SAC openings;

performing a first chemical mechanical polishing (CMP), procedure to form a first group of storage node contact structures, comprised of said first polysilicon layer, in a first group of SAC openings, and forming a lower level bit line contact structure, comprised of said first polysilicon layer, in a second SAC opening;

depositing a second silicon oxide layer;

forming capacitor openings in said second silicon oxide layer, exposing the top surface of said storage node contact structures, and forming a narrow diameter, bit line contact hole, exposing a portion of the top surface said lower level bit line contact structure;

depositing a second polysilicon layer, coating exposed surfaces of said capacitor opening while completely filling said narrow diameter bit line contact hole;

forming a hemispherical grain (HSG), silicon layer on said second polysilicon layer;

performing a second CMP procedure removing portions of said HSG silicon layer, and portions of said second polysilicon layer, from the top surface of said second silicon oxide, to simultaneously form said storage node structures in said capacitor openings, and said upper level, bit line contact structure in said narrow bit line contact hole;

depositing a capacitor dielectric layer;

depositing a third polysilicon layer;

depositing a third silicon oxide layer;

performing a patterning procedure comprised of removal of exposed portions of said third silicon oxide layer, of said third polysilicon layer, and of said capacitor dielectric layer, forming said bit line opening, exposing the top surface of said upper level bit line contact structure, and simultaneously defining said capacitor structures, comprised of an overlying top electrode structure, defined from said third polysilicon layer, and comprised of said capacitor dielectric layer, and of said storage node structure;

forming second silicon nitride spacers on the sides of said bit line opening;

depositing a titanium layer;

depositing a titanium nitride layer;

depositing a tungsten layer completely filling said bit line opening; and patterning of said tungsten layer, of said titanium nitride layer, and of said titanium layer, forming a bit line structure in said bit line contact opening.

18. The method of claim 17, wherein said first silicon oxide layer is obtained via LPCVD or PECVD procedures, at a thickness between about 5000 to 10000 Angstroms.

19. The method of claim 17, wherein said first polysilicon layer is obtained via LPCVD procedures, and doped in situ during deposition via the addition of arsine, or phosphine, to a silane ambient.

20. The method of claim 17, wherein said second silicon oxide layer is obtained via LPCVD or PECVD procedures, at a thickness between about 8000 to 20000 Angstroms.

21. The method of claim 17, wherein said capacitor openings, and said narrow diameter bit line contact hole, are formed via an anisotropic RIE procedure using $CF_4$ or $CHF_3$ as an etchant for said second silicon oxide layer.

22. The method of claim 17, wherein the diameter of said narrow diameter bit line contact hole is between about 0.15 to 0.25 um.

23. The method of claim 17, wherein said second polysilicon layer is obtained via LPCVD procedures at a thickness between about 1000 to 2000 Angstroms.

24. The method of claim 17, wherein said HSG silicon layer is formed via deposition of an HSG silicon seed layer, at a temperature between about 500 to 550° C., followed by anneal procedure, performed at a temperature between about 550 to 580° C., converting the HSG silicon seed layer to said HSG silicon layer.

25. The method of claim 17, wherein said capacitor dielectric layer is an oxidized silicon nitride (NO), layer, formed at a thickness between about 40 to 60 Angstroms.

26. The method of claim 17, wherein said capacitor dielectric layer, at a thickness between about 40 to 100 Angstroms, is chosen from a group comprised with silicon oxide, silicon nitride, silicon oxynitride, or tantalum oxide.

27. The method of claim 17, wherein said third polysilicon layer is obtained via LPCVD procedures, at a thickness between about 500 to 1500 Angstroms, and doped in situ during deposition via the addition of arsine, or phosphine, to a silane ambient.

28. The method of claim 17, wherein said third silicon oxide layer is obtained via LPCVD or PECVD procedures, at a thickness between about 2000 to 4000 Angstroms.

29. The method of claim 17, wherein said patterning procedure, used to simultaneously define said capacitor structures, and said bit line opening, is an anisotropic RIE procedure, using $CHF_3$ as an etchant for said third silicon oxide layer and for said capacitor dielectric layer, while using $Cl_2$ as an etchant for said third polysilicon layer.

30. The method of claim 17, wherein said second silicon nitride spacers, or silicon oxide spacers, are formed from a silicon nitride, or from a silicon oxide layer, which in turn was obtained via LPCVD or PECVD procedures, at a thickness between about 500 to 1500 Angstroms, then defined via a blanket anisotropic RIE procedure, using $Cl_2$ or $CF_4$ as an etchant.

31. The method of claim 17, wherein said bit line structure is comprised of said underlying titanium layer, obtained via PVD procedures at a thickness between about 100 to 400 Angstroms, comprised of said titanium nitride layer, obtained via PVD procedures at a thickness between about 100 to 400 Angstroms, and comprised of said overlying tungsten layer, obtained via LPCVD procedures at a thickness between about 1000 to 2000 Angstroms.

* * * * *